United States Patent
Paniconi (10) Patent No.: US 8,856,624 B1
(45) Date of Patent: Oct. 7, 2014

(54) METHOD AND APPARATUS FOR DYNAMICALLY GENERATING ERROR CORRECTION

(75) Inventor: Marco Paniconi, Campbell, CA (US)

(73) Assignee: Google Inc., Mountain View, CA (US)

( * ) Notice: Subject to any disclaimer, the term of this patent is extended or adjusted under 35 U.S.C. 154(b) by 136 days.

(21) Appl. No.: 13/283,184

(22) Filed: Oct. 27, 2011

(51) Int. Cl.
*H03M 13/00* (2006.01)

(52) U.S. Cl.
USPC ...... 714/776; 714/752; 714/758; 375/240.13; 375/240.01

(58) Field of Classification Search
CPC .............................. H04L 1/007; H04L 65/607
USPC ......... 714/752, 758, 776; 375/240.01, 240.13
See application file for complete search history.

(56) References Cited

U.S. PATENT DOCUMENTS

| | | | |
|---|---|---|---|
| 6,195,391 B1 | 2/2001 | Hancock et al. | |
| 6,556,588 B2 | 4/2003 | Wan et al. | |
| 6,681,362 B1 | 1/2004 | Abbott et al. | |
| 6,732,313 B2 | 5/2004 | Fukushima et al. | |
| 7,577,898 B2 | 8/2009 | Costa et al. | |
| 7,710,973 B2 | 5/2010 | Rumbaugh et al. | |
| 8,060,651 B2 * | 11/2011 | Deshpande et al. | 709/246 |
| 8,494,053 B2 | 7/2013 | He et al. | |
| 8,553,776 B2 | 10/2013 | Shi et al. | |
| 2002/0157058 A1 * | 10/2002 | Ariel et al. | 714/774 |
| 2003/0012287 A1 | 1/2003 | Katsavounidis et al. | |
| 2003/0229822 A1 * | 12/2003 | Kim et al. | 714/18 |
| 2004/0196902 A1 | 10/2004 | Faroudja | |
| 2005/0157793 A1 | 7/2005 | Ha et al. | |
| 2005/0185715 A1 | 8/2005 | Karczewicz et al. | |
| 2005/0259729 A1 | 11/2005 | Sun | |
| 2006/0013310 A1 | 1/2006 | Lee et al. | |
| 2006/0248563 A1 * | 11/2006 | Lee et al. | 725/117 |
| 2006/0291475 A1 | 12/2006 | Cohen | |
| 2007/0250754 A1 * | 10/2007 | Costa et al. | 714/758 |
| 2008/0089414 A1 | 4/2008 | Wang et al. | |
| 2008/0109707 A1 | 5/2008 | Dell et al. | |
| 2008/0134005 A1 | 6/2008 | Izzat et al. | |
| 2008/0250294 A1 * | 10/2008 | Ngo et al. | 714/752 |
| 2009/0007159 A1 | 1/2009 | Rangarajan et al. | |
| 2009/0022157 A1 | 1/2009 | Rumbaugh et al. | |
| 2009/0059067 A1 | 3/2009 | Takanohashi et al. | |
| 2009/0059917 A1 | 3/2009 | Lussier et al. | |
| 2009/0080510 A1 * | 3/2009 | Wiegand et al. | 375/240.01 |
| 2009/0103635 A1 * | 4/2009 | Pahalawatta | 375/240.27 |
| 2009/0122867 A1 | 5/2009 | Mauchly et al. | |

(Continued)

OTHER PUBLICATIONS

Liang, Y.J.; Apostolopoulos, J.G.; Girod, B., "Analysis of packet loss for compressed video: does burst-length matter?," Acoustics, Speech and Signal Processing, 2003. Proceedings. (ICASSP '03). 2003 IEEE International conference on, vol. 5, no., pp. V, 684-687 vol. 5, Apr. 6-10, 2003.

(Continued)

*Primary Examiner* — Sam Rizk
(74) *Attorney, Agent, or Firm* — Young Basile Hanlon & MacFarlane P.C.

(57) ABSTRACT

A method and apparatus for dynamically selecting forward error correction codes to accompany transmitted packet data on a network is taught. Source content parameter(s) and network state parameter(s) are analyzed to select either equal protection (EP) error correction or unequal correction (UEP) error correction. Selection of UEP error correction versus EP error correction improves the perceived quality of transmitted data without requiring additional error correction overhead.

32 Claims, 8 Drawing Sheets

(56) References Cited

U.S. PATENT DOCUMENTS

| | | |
|---|---|---|
| 2009/0245351 A1 | 10/2009 | Watanabe |
| 2009/0268819 A1 | 10/2009 | Nishida |
| 2009/0276686 A1 | 11/2009 | Liu et al. |
| 2010/0122127 A1 | 5/2010 | Oliva et al. |
| 2010/0153828 A1 | 6/2010 | De Lind Van Wijngaarden et al. |
| 2010/0202414 A1 | 8/2010 | Malladi et al. |
| 2010/0235820 A1 | 9/2010 | Khouzam et al. |
| 2010/0306618 A1 | 12/2010 | Kim et al. |
| 2010/0309372 A1 | 12/2010 | Zhong |
| 2010/0309982 A1 | 12/2010 | Le Floch et al. |
| 2011/0194605 A1* | 8/2011 | Amon et al. ............. 375/240.13 |
| 2011/0218439 A1 | 9/2011 | Masui et al. |
| 2012/0287999 A1 | 11/2012 | Li et al. |
| 2013/0031441 A1* | 1/2013 | Ngo et al. ..................... 714/758 |

OTHER PUBLICATIONS

Yoo, S. J.B., "Optical Packet and burst Switching Technologies for the Future Photonic Internet," Lightwave Technology, Journal of, vol. 24, No. 12, pp. 4468, 4492, Dec. 2006.

\* cited by examiner

FAVOR EP:
- STRONGER EC ON 1st PARTITION
- RANDOM PACKET LOSS

FIG. 7B

FAVOR UEP:
- EC NO EFFECTIVE ON 1st PARTITION
- BURSTY PACKET LOSS

METHOD AND APPARATUS FOR DYNAMICALLY GENERATING ERROR CORRECTION

TECHNICAL FIELD

The present invention relates to the field of data transmission generally and in particular to techniques for dynamically setting a forward error correction (FEC) type as equal or unequal.

BACKGROUND

Many kinds of data are transmitted over the Internet and other networks, including video and audio data. Data can be transmitted, for example, from one computer or other transmitting station to another remote computer or other receiving station. Data transmission over networks such as the Internet is frequently accomplished by packetizing the message to be transmitted—that is, by dividing the message into packets that are reassembled at the receiving end to reconstruct the original message. Packets may be lost or delayed during transmission, resulting in corruption of the message. This can be especially problematic when it occurs during real time transmission of data (such as during a voice over IP (VOIP) session or video conferencing).

SUMMARY

An apparatus and method are disclosed that dynamically generate error correction codes to be used with a plurality of source packets to be transmitted over a network. In accordance with one aspect of the disclosed embodiments, the plurality of source packets has frames and first partition packets and the method comprises determining at least one source content parameter of a first plurality of source packets, determining at least one network state parameter of the network, selecting between an equal protection forward error correction code and an unequal protection forward error correction code for the first plurality of source packets based on the at least one source content parameter and the at least one network state parameter, and generating a data stream comprising the first plurality of source packets and the selected forward error correction code.

In accordance with another aspect of the disclosed embodiments, an apparatus is provided for dynamically selecting forward error correction codes for use with a plurality of source packets to be transmitted over a network. The apparatus comprises a memory and a processor configured to execute instructions stored in the memory to determine at least one source content parameter of a first plurality of source packets, determine at least one network state parameter of the network, select between an equal protection forward error correction code and an unequal protection forward error correction code for the first plurality of source packets based on the at least one source content parameter and the at least one network state parameter, and generate a data stream comprising the first plurality of source packets and the equal protection forward error correction code or the unequal protection forward error correction code as selected.

These and other embodiments will be described in additional detail hereafter.

BRIEF DESCRIPTION OF THE DRAWINGS

The description herein makes reference to the accompanying drawings wherein like reference numerals refer to like parts throughout the several views, and wherein.

DETAILED DESCRIPTION

A common type of real-time data transmission includes digital video. Digital video is used for various purposes including, for example, remote business meetings via video conferencing, high definition video entertainment, video advertisements, and sharing of user-generated videos. As technology is evolving, users have higher expectations for video quality and expect high resolution video even when transmitted over communications channels having limited bandwidth.

To address the problem of packet loss and other errors, schemes have been proposed for providing additional information in transmissions of data. This additional information can be used by the receiving station to detect and/or correct errors. One such scheme is forward error-correction (FEC) coding, also called channel coding. See, e.g., Lee, A. "RTP Payload Format for Generic Forward Error Correction," RFC 5109, December, 2007. Under this approach, an FEC packet is applied as an XOR channel code. The XOR code is used to generate the FEC packets by means of a packet mask.

Errors that lead to packet loss can be distributed randomly during the transmission or be distributed in "bursty" fashion, wherein certain errors are grouped together for a period of time. Furthermore, in some video coders not all packets have the same information content. For example, in encoded video transmission, it is likely that the initial packets associated with a video frame contain information derived from the video transmission such as motion vectors. The result is that uncorrected packet loss occurring in the initial packets associated with a video frame can cause greater subjective degradation in the received and decoded video transmission than uncorrected packet loss occurring in other packets of the frame. In the case where errors are distributed substantially randomly, FEC coding that treats each packet equally perform well. In the case where errors are distributed in a bursty fashion, FEC coding that treats each packet equally does not perform as well. FEC coding can be improved by adding more error correction information. However, adding more error correction information decreases the effective bandwidth of the transmission.

In contrast, dynamically selecting forward error correction (FEC) codes based on the network state and the type of packet to be transmitted is taught herein. Such a selection scheme is designed to improve the quality of packetized data transmission where the packets have differing information content, particularly in the presence of bursty errors, without reducing the effective bandwidth.

Figure 1:
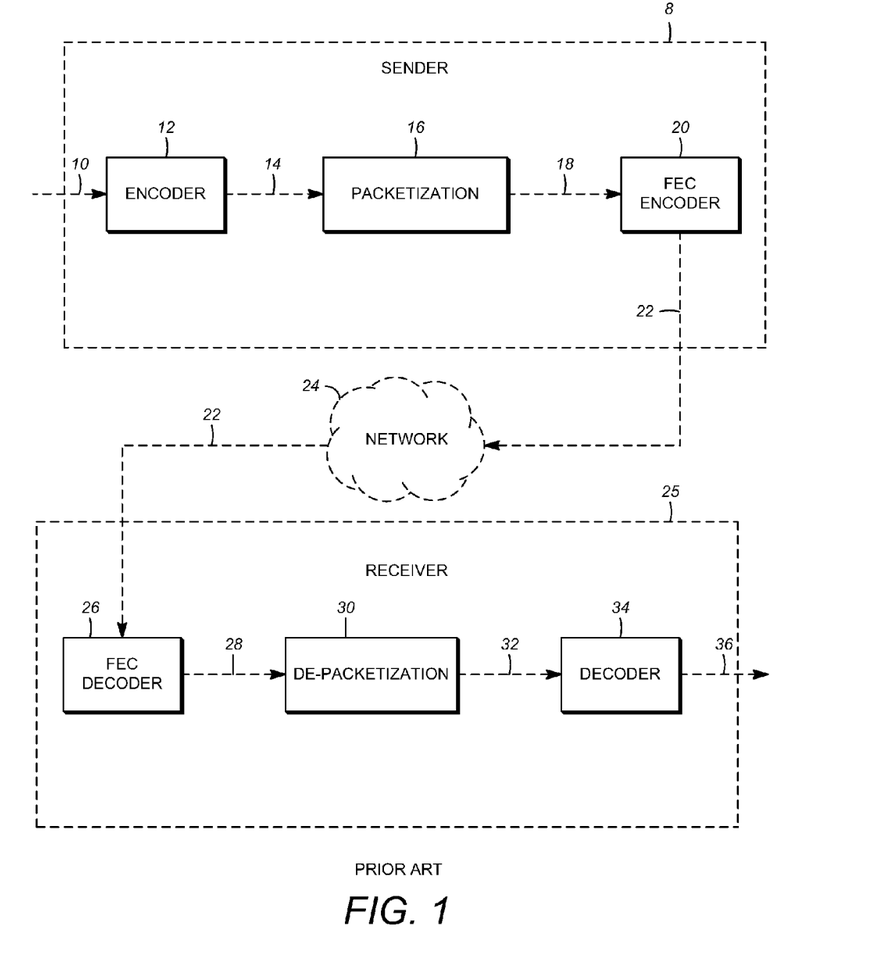
FIG. 1 is a block diagram showing a data transmission system.

FIG. 1 is a block diagram showing a known data transmission system. The data transmission system includes a sender 8, which includes a video source 10 and an encoder 12 that encodes video source 10 to create an encoded video stream 14, which is packetized by a packetization process 16 to form encoded packets 18. These encoded packets 18 are processed by an FEC encoder 20 to form an encoded packet and FEC stream 22 that is transmitted to a network 24. The encoded packet and FEC stream 22 is delivered to a receiving station or receiver 25 where an FEC decoder 26 processes the encoded packet and FEC stream 22 to form a recovered source packet stream 28. Recovered source packet stream 28 is subsequently processed by a de-packetization process 30 to form an encoded video stream 32. Encoded video stream 32 is processed by a decoder 34 to form an output video stream 36.

Figure 2:
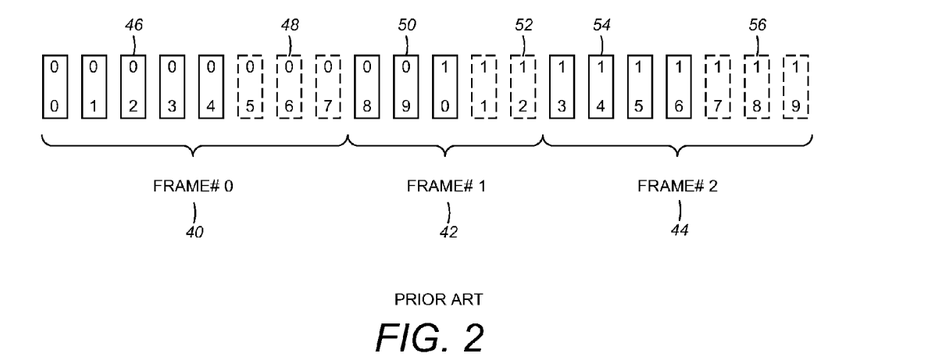
FIG. 2 is a schematic diagram showing packets with error correction codes.

FIG. 2 shows more detail for exemplary encoded packet and FEC stream 22. FIG. 2 is a schematic diagram showing packets with error correction codes. Three data frames 40, 42, 44 as shown can correspond to sequential video frames #0, #1, #2. First frame 40 includes source packets 00, 01, 02, 03, 04 (collectively source packets 46) and FEC packets 05, 06, 07 (collectively FEC packets 48). Second frame 42 includes source packets 08, 09, 10 (collectively source packets 50) and FEC packets 11, 12 (collectively FEC packets 52). Third frame 44 includes source packets 13, 14, 15, 16 (collectively source packets 54) and FEC packets 17, 18, 19 (collectively FEC packets 56). As can be seen in FIG. 2, source packets 46, 50, 54 are shown in solid outlines, and FEC packets 48, 52, 56 are shown in dashed outlines. In this example, FEC packets 48 are available to correct potential errors in source packets 46 of first frame 40, FEC packets 52 are available to correct potential errors in source packets of second frame 42, and FEC packets 56 are available to correct potential errors in source packets 54 of third frame 44. FEC encoder 20 in this example treats each packet equally.

Figure 3A:
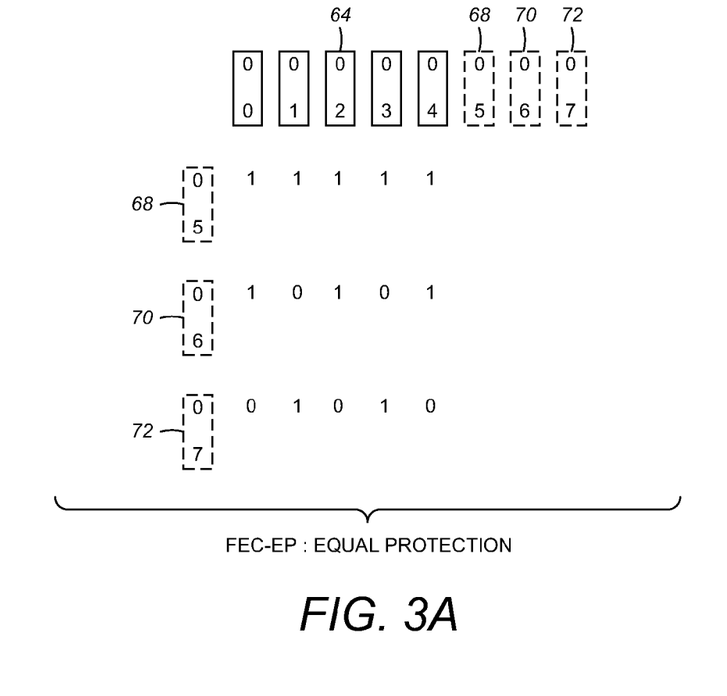
FIG. 3A is a schematic diagram showing equal forward error correction codes for a frame.

Treating each packet equally for error protection can be undesirable as described above. Thus, embodiments taught herein select error correction codes to be transmitted with packetized data over a communications network by distinguishing between equal protection error correction (FEC-EP) and un-equal protection error correction (FEC-UEP). FIG. 3A is a schematic diagram showing equal forward error correction codes for a frame, while FIG. 3B is a schematic diagram showing unequal forward error correction codes for the frame of FIG. 3A.

In FIG. 3A, source packets 00, 01, 02, 03, 04 (collectively source packets 64) are accompanied by calculated FEC-EP packets 05, 06, 07 (FEC-EP packet 68, FEC-EP packet 70 and FEC-EP packet 72, respectively). In the matrix, "1" in a row indicates that data from the source packet in the column above the "1" is included in the XOR operation of the FEC-EP packet, and a "0" in the row indicates that data from the source packet in the column above the "0" is not included in the FEC-EP packet. Accordingly, FEC-EP packet 68 contains information from all five source packets 64 as indicated by the 1's in the columns under source packets 64, FEC-EP packet 70 contains information from alternating source packets 00, 02, 04 as indicated by the 1's and 0's, and FEC-EP packet 72 contains information from alternating source packets 01, 03 as indicated by the 1's and 0's. This is called equal protection error correction because each of source packets 64 is protected by an equal number of FEC packets.

Figure 3B:
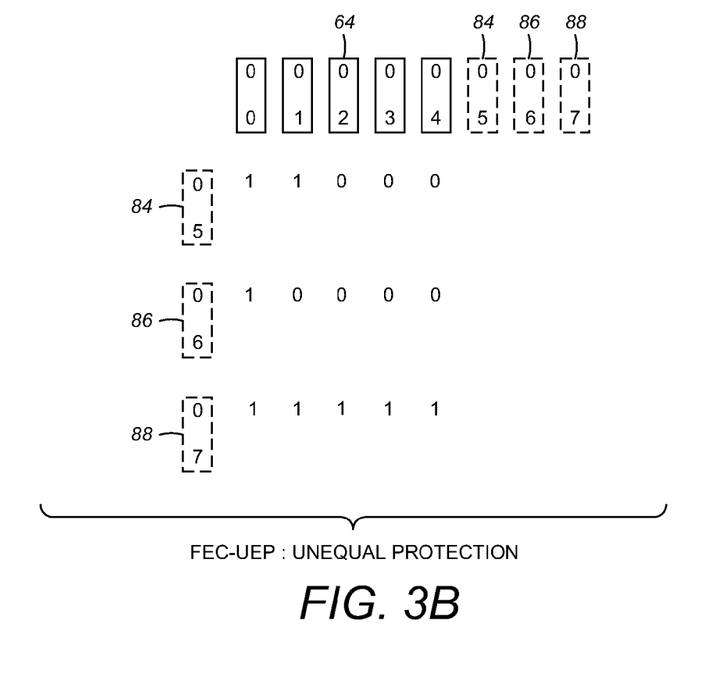
FIG. 3B is a schematic diagram showing unequal forward error correction codes for the frame of FIG. 3A.

In FEC-UEP shown in FIG. 3B, source packets 64 are accompanied by three FEC-UEP packets 05, 06, 07 (FEC-UEP packet 84, FEC-UEP packet 86 and FEC-UEP packet 88, respectively) of substantially similar size as they are in FEC-EP correction shown in FIG. 3A. FEC-UEP packet 84 is selected based on information from source packets 00 and 01, FEC-UEP packet 06 is based on information from source packet 01, and FEC-UEP packet 07 is based on information from source packets 00, 01, 02, 03, 04, 05. Examination of this scheme shows that FEC-UEP packet 05 contains information from two source packets, FEC-UEP packet 06 contains information from one source packet, and FEC-UEP packet 07 contains information from five source packets. In this way, FEC-UEP scheme provides a greater ability to correct errors in source packets 00 and 01 relative to source packets 02, 03, 04 and 05 than the FEC-EP scheme of FIG. 3A while requiring no additional FEC overhead, since the total number of packets transmitted, including both source packets and FEC packets, is the same. FEC-UEP error correction provides improved received data quality in cases where information content of source packets is asymmetric and errors are bursty without reducing transmission bandwidth by requiring additional FEC data.

Figure 4:
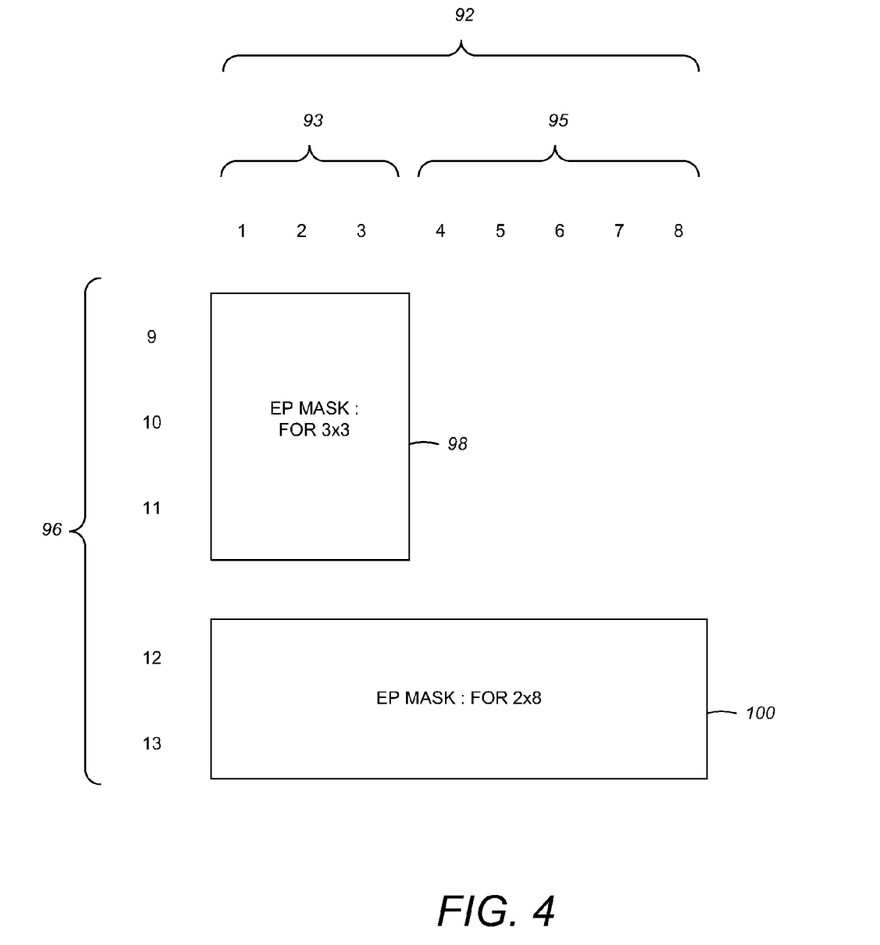
FIG. 4 is a schematic diagram showing an unequal forward error correction code formed from two equal error correction codes formed according to an embodiment of the invention.

FIG. 4 is a schematic diagram showing an unequal forward error correction code formed from two equal error correction codes according to an embodiment of the invention. In this example, source packets 92 are divided up into two groups, important packets 1, 2 and 3 (collectively, packets 93) and less important packets 4, 5, 6, 7, 8 (collectively, packets 95). There are five correction (FEC-UEP) packets 96 (individually, packets 9-13). According to this embodiment, three FEC-UEP packets 9, 10, 11 are based on important source packets 93 while ignoring the remaining packets 95. The remaining two FEC-UEP packets 12 and 13 are selected to include information from all eight source packets 92. The FEC-UEP scheme is implemented by selecting pre-calculated FEC-EP packets generated using packet masks 98, 100 to form FEC-UEP packets 96.

In another embodiment, an equal forward error correction code may be formed by using a single pre-calculated FEC-EP packet mask, and increasing the number of is (i.e., replace some of the 0 entries by 1) in the columns corresponding to the first partition source packets. The greater number of 1s in the column entries corresponding to the first partition packets means that more FEC protection is applied to the first partition.

More specifically, packet masks 98, 100 are each a matrix that specifies the linear combination of source packets to generate an FEC packet. The linear combination is applied over the packet data by a bitwise XOR as is known in the art. The packet mask (or the relevant row of the matrix/mask for that packet) is contained in each FEC packet, so decoder 34 has access to this information (at least for a received FEC packet), and hence can perform a recovery operation if needed. For example, referring to FIG. 4, packet mask 98 is represented by a three-by-three matrix having three rows and three columns. The rows correspond to FEC packets 9-11, and the columns correspond to source packets 1-3. Packet mask 100 is represented by a two-by-eight matrix having two rows and eight columns. The values of each matrix are either one or zero, with one indicating which source packets are combined (via an XOR operation) to create the corresponding FEC packet in a similar manner as in FIGS. 3A and 3B. Each packet mask 98, 100 is thus a matrix with each row corresponding to a particular FEC packet. In accordance with RFC 5109, that particular FEC packet includes in its header the underlying mask (i.e., the row data from the packet mask corresponding to the FEC packet) so that upon arrival at receiver 25 the FEC packet can be used to reconstruct missing source packets.

This scheme is able to use pre-calculated FEC-EP packets to accomplish FEC-UEP by considering a subset of the source packets to be transmitted, in this case packets 1-3, and selecting the appropriate FEC-EP packets 9-11 to correct these packets. The scheme then considers the entire set of eight source packets 92 and selects two more FEC-EP packets 12, 13 to correct all eight packets 92. This provides a total of five packets 9-13 with information to correct important source frames 93 and two packets 12, 13 with information to correct less important source frames 95. This provides a higher level of error correction for source packets 93 and a lower level of error correction for source packets 95 than would be obtained by transmitting the same number of purely FEC-EP packets that each considered all eight source packets 92. This scheme provides the advantages of having improved error correction for important source packets 93 while permitting the system to calculate a set of FEC-EP packets 9-13 that can be accessed by look-up tables or other efficient methods to provide efficient run-time implementations of this FEC-UEP scheme. By using a variety of EP masks, various levels of protection can be provided for a number of source packets.

Figure 5:
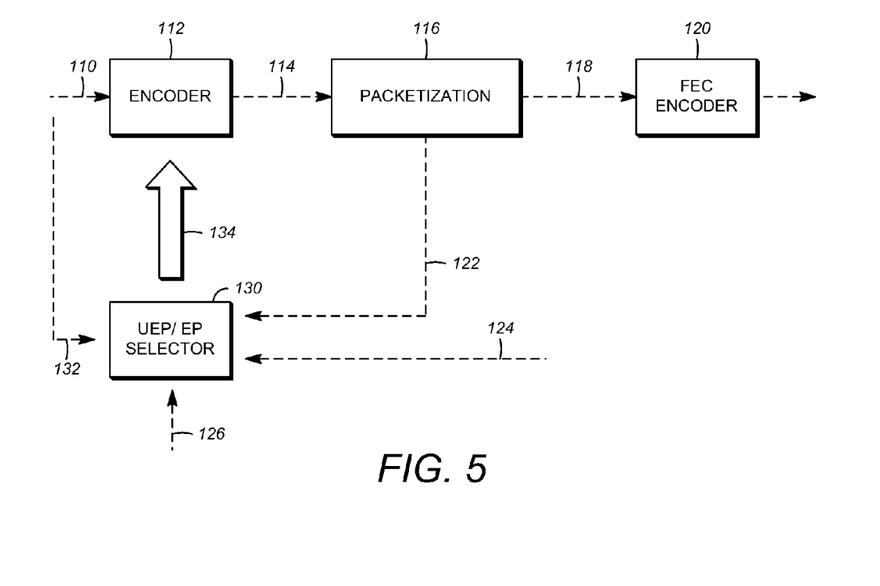
FIG. 5 is a block diagram showing a modification to the data transmission system of FIG. 1 according to an embodiment of the invention.

FIG. 5 is a block diagram showing a modification to the data transmission system of FIG. 1 according to an embodiment of the invention. Therein, a video source 110 is encoded by an encoder 112. The encoded video 114 is packetized by a packetization process 116. The encoded packets 118 are then processed by a FEC encoder 120 for subsequent transmission to network 24. Observing this process is a UEP/EP selector 130. UEP/EP selector 130 monitors the video content state or source content parameters 132 of video source 110 including motion level (ML), spatial level (SL) and video resolution (frame rate and frame size). UEP/EP selector 130 also monitors the encoded/packetized data to obtain the ratio 122 of first partition size to total size (c). UEP/EP selector 130 also monitors network state parameters 124 including packet loss rate (p), burstiness (b) and network rate (R) along with a predetermined decoder concealment capability 126 to determine whether to select unequal protection (UEP) or equal protection (EP). The selection is then communicated to encoder 112 and FEC encoder 120 to implement the selection via path 134.

Figure 6:
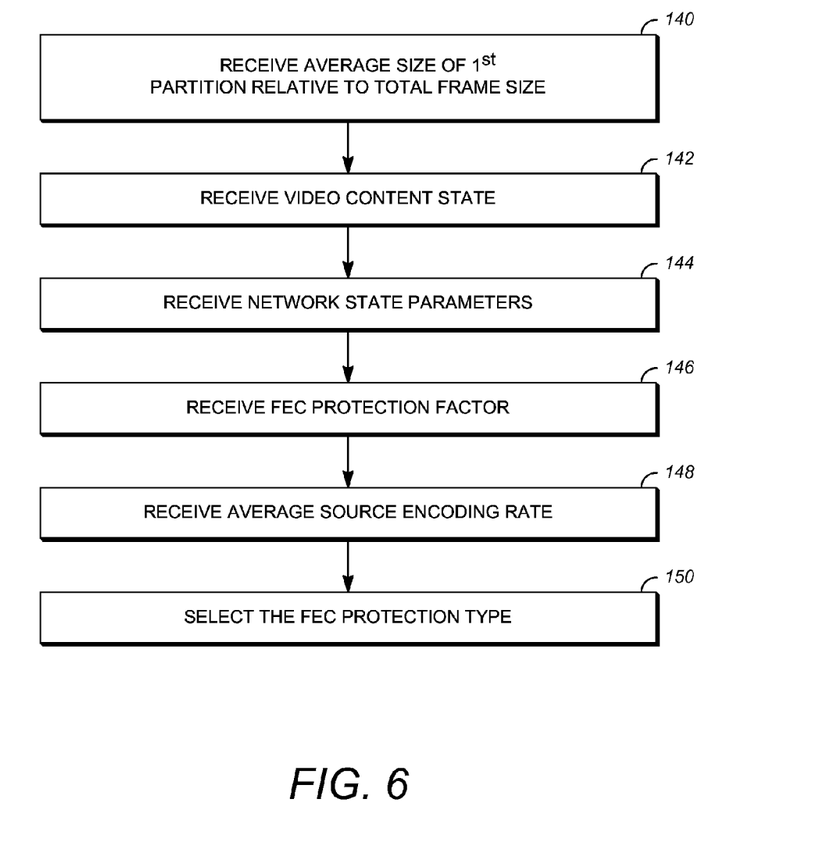
FIG. 6 is a flowchart showing selection of error correction codes in the data transmission system of FIG. 5.

FIG. 6 is a flowchart showing the process for the selection of the FEC protection type in the data transmission system of FIG. 5. This is also called a UEP/EP selection process, and it is described generally and then in additional detail. In general, the amount of data to be used for error correction (PF) is predetermined. In step 140, UEP/EP selector 130 receives data representing the average size of the first partition relative to the total frame size (c) from the encoder 112 during a preselected time interval T, typically one or more seconds. Packets in the first partition typically contain more important information than the remaining packets. For example, in video data the first partition may contain information required to decode the entire frame. If a packet in the first partition is lost, the entire frame may not be able to be decoded. In a worst case, video synchronization might be lost and the video stream would have to be halted until the video is re-synchronized. If a packet in a less important partition is lost, a portion of the frame might be garbled, but the frame would mostly be displayed correctly and the video stream would continue uninterrupted.

UEP/EP selector 130 receives information regarding the video content state 132, including motion level (ML), spatial level (SL), frame rate (f), and frame size in step 142 from the encoder 112. UEP/EP selector 130 then receives network state parameters 124, including packet loss rate (p), burst length (b) and network rate (R), in step 144 from the network state parameters 124 and with the predetermined FEC protection factor (PF) that determines how large the FEC overhead will be in relation to the data stream in step 146. FEC protection factor PF specifies the amount of FEC packets for a given frame according to the formula m=PF*n, where n is the total number of packets in a given frame and m is the number of FEC packets to be applied to that frame. In step 148, UEP/EP selector 130 calculates the average source encoding rate $R_s$, which is calculated from the predetermined protection factor PF and the network rate R obtained from the network state parameters 124 according to equation (1) below. Based on the received/calculated parameters, UEP/EP selector 130 selects the FEC protection type, either unequal protection or equal protection, in step 150 and communicates the selection to encoder 112 as indicated by path 134 in FIG. 5. Although UEP/EP selector 130 is shown separate from encoder 112, UEP/EP selector 130 could be implemented within encoder 112.

The processing of FIG. 6 repeats at preselected intervals during the data transmission process, typically on the order of one or more seconds. Note that UEP/EP selector 130 also has an understanding of decoder concealment capability 126 (also called EC herein). This is the ability of decoder 34 to recover from transmission errors in the absence of error correction. For example, different decoders may have differing abilities to recover from errors that occur in the first partition containing important frame. Understanding these differences can influence the choice of unequal or equal protection for a given frame using a given decoder.

Figure 7A:
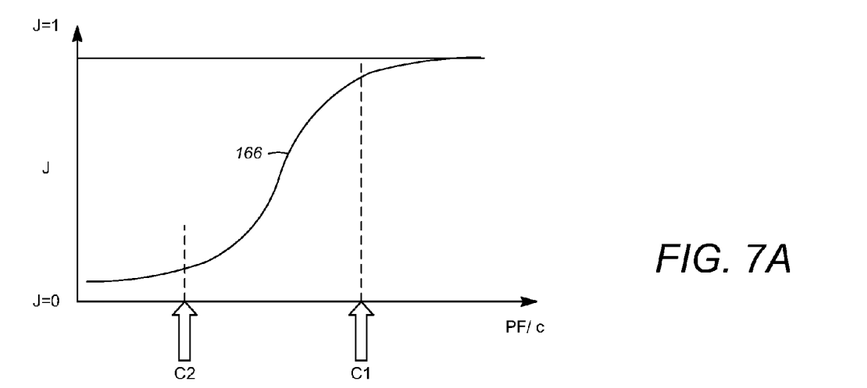
FIGS. 7A-7C show three exemplary curves used to select error correction codes in the processing described with respect to FIG. 6.
Figure 7B:
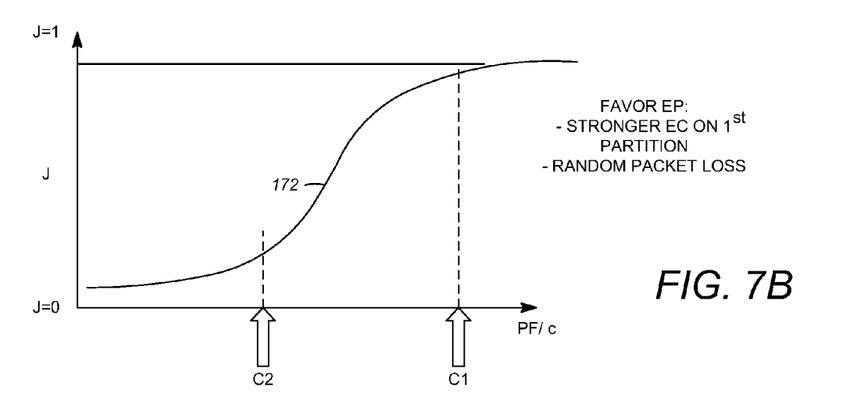
Figure 7C:
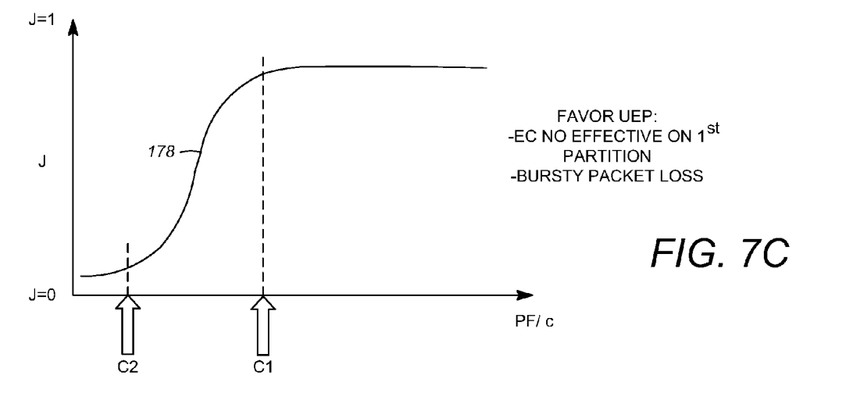

FIGS. 7A-7C show three exemplary curves used to select error correction codes in the processing described with respect to FIG. 6. Motion level (ML), obtained from the encoder 112, is encoded as discrete states 0, 1 and 2 representing low, medium or high scene motion. Spatial level (SL), also obtained from the encoder 112, is encoded as discrete states 0, 1 and 2 representing low, medium or high scene spatial content. FEC protection factor PF is encoded as a percentage from 0% (no protection) to 50% (maximum protection). The size c of the first partition containing important information compared to the frame size and obtained from the encoder 112 is encoded as a percentage from 0 to 100%. The frame rate f of encoder 112 is measured in frames per second. The network rate R is measured in kilobits/second, and packet loss p on the network is measured a percentage from 0 to 50%. The burstiness b of packet loss is represented by a burst length parameter, which measures the average length of consecutive packet loss. These latter variables are all obtained as network state parameters 124 according to known techniques.

ML is measured by detecting the motion level from motion vectors obtained from the encoding process or from a simple frame-to-frame difference operator. SL is obtained by measuring the edges or texture with the frames according to known techniques. ML and SL are averaged over the interval T. Preselected thresholds are then used to classify the motion and spatial levels as low, medium or high. PF determines how many FEC packets are applied during each T second time interval and to set the source encoding rate $R_s$ equal to network rate R reduced by the percentage of FEC packets as follows:

$$R_s = R(1-PF). \tag{1}$$

The relative size c of the first partition to the total frame is calculated from previously encoded frames and the frame rate f is based, for example, on a camera capture rate. UEP/EP selector 130 calculates a function F that maps the variables listed above into a protection-type state y wherein:

$$y = F(ML, SL, PF, c, R, f, p, b). \quad (2)$$

A threshold H may be used to map the output into a binary state such that y<H results in UEP/EP selector 130 selecting EP in step 150, and y≥H results in UEP/EP selector 130 selecting UEP in step 150. A typical default value might be H=0.5.

An embodiment of the instant invention, the selection can be based on a reduced set of parameters. In this case, three parameters are used according to the formula:

$$y = G(ML) * J(PF/c); \text{ wherein} \quad (3)$$

J is a sigmoid-type function that will asymptotically approach 1 for PF/c>>C1, asymptotically approach 0 if PF/c<<C2 and interpolate smoothly in between; and G is a function that maps the discrete motion level state to an analog scale. UEP/EP selector again uses a threshold H to map the output y into a binary state to select EP or UEP as above.

As shown in FIGS. 7A-7C, the parameters C1 and C2, where C1>C2, characterize the transition points on the sigmoid curve J. The function G may be further defined, in one implementation, as:

$$G(ML=0)=0: \text{ favor EP for stationary scenes}; \quad (4)$$

$$G(ML=1)=1.0: \text{ neutral; and} \quad (5)$$

$$G(ML=2)=1.5: \text{ favor UEP for motion scenes}. \quad (6)$$

In this scheme, an FEC-EP scheme is favored when the motion level is low or when the amount of FEC protection selected is close to or smaller than c, the size of the first partition. These cases are favorable to EP-type error correction since error concealment for most decoders is very good for stationary scenes and the FEC protection is small compared to the size of the first partition. The values of C1 and C2 can be set depending upon the error concealment property EC of the particular decoder used and the burstiness b of the network. For example, the stronger EC is on the first partition, the less UEP is relied upon, therefore C1 and C2 can be increased. On the other hand, the burstier the network packet loss is, the more it would favor UEP, since FEC-UEP is more robust with respect to bursty loss. In this case, C1 and C2 would be decreased.

Three exemplary curves 166, 172, 178 that may be generated to guide the selection of unequal or equal packet protection schemes are shown by example in FIGS. 7A-7C. Each plots values of the function J vs. PF/c, and C2 and C1 denote the inflection points of curves 166, 172, 178. In FIG. 7B, curve 172 has points C2 and C1 with values higher than their values in FIG. 7A. For example, this may be because the error concealment EC of the decoding algorithm is more robust than that used to in generate curve 166, thereby requiring less reliance on UEP. In FIG. 7C, the values of points C2 and C1 are lower than their values in FIGS. 7A and 7B. This can be due to increased bursty losses since FEC-EP is generally less efficient than FEC-UEP in the presence of bursty losses. In practice, C1 and C2 are predetermined according to known error concealment (EC) properties of the decoder and the burstiness of the network. PF and c are input and a value for J is calculated according to equation (3) above and multiplied by the function G of the discrete motion level (ML) (equations 4, 5 and 6) and thresholded to determine whether to use EP or UEP.

In yet another embodiment, a training approach may be used to generate the mapping function that selects the UEP/EP state. This approach involves off-line training over a set of test simulations. Each simulation is defined by previously defined parameters ML, SL, R, f, p, b and PF. The test data could be a representative video clip of a few seconds. The parameter c is implicitly defined by the scene content (ML, SL), the encoder bit rate R and the frame rate f. A large set of simulations over different representative video clips and parameter ranges would be used to generate a training sample for the function below:

$$y = F(ML, SL, R, f, p, b, PF). \quad (7)$$

For each simulation a quality score that compares the input data stream to the output is used. For example, as peak signal to noise ratio (PSNR) or a structural similarity score (SSIM) is calculated. Each simulation would be scored with the EP and UEP settings. A clustering approach is used to cluster all the simulation results that favor UEP over EP into one group and the results that favor EP over UEP in to another group. The mapping function may then be adjusted to yield these results on subsequent data by estimating the image and network parameters that would yield optimal error correction. An example of a learning/clustering model that may be used in this application is a support vector machine.

In another embodiment, UEP/EP 130 selector may operate at the frame level, making a further decision or overriding the decision from the method described with respect to FIG. 6, on the UEP/EP type for each encoded frame. In this approach, the frame-level UEP/EP will use the following variables: the protection factor PF, the number of source packets in the frame (n) and the number of important (first partition) packets in the frame (k). The protection factor PF is used to determine the exact number of FEC packets (m) for the frame according to m=(PF*n). Based on the three discrete variables (n, m, k), the selector may at the frame level select the UEP/EP state.

In one implementation, the process to select the UEP protection is done using a designated number (z) of FEC packets solely for protection of the first partition, where z=H(n,m,k). If z=0, then the EP protection type is selected. In one example, we use z=H(n,m,k)=min(k,m/2) (where min(a,b) is the minimum of a and b).

Figure 8:
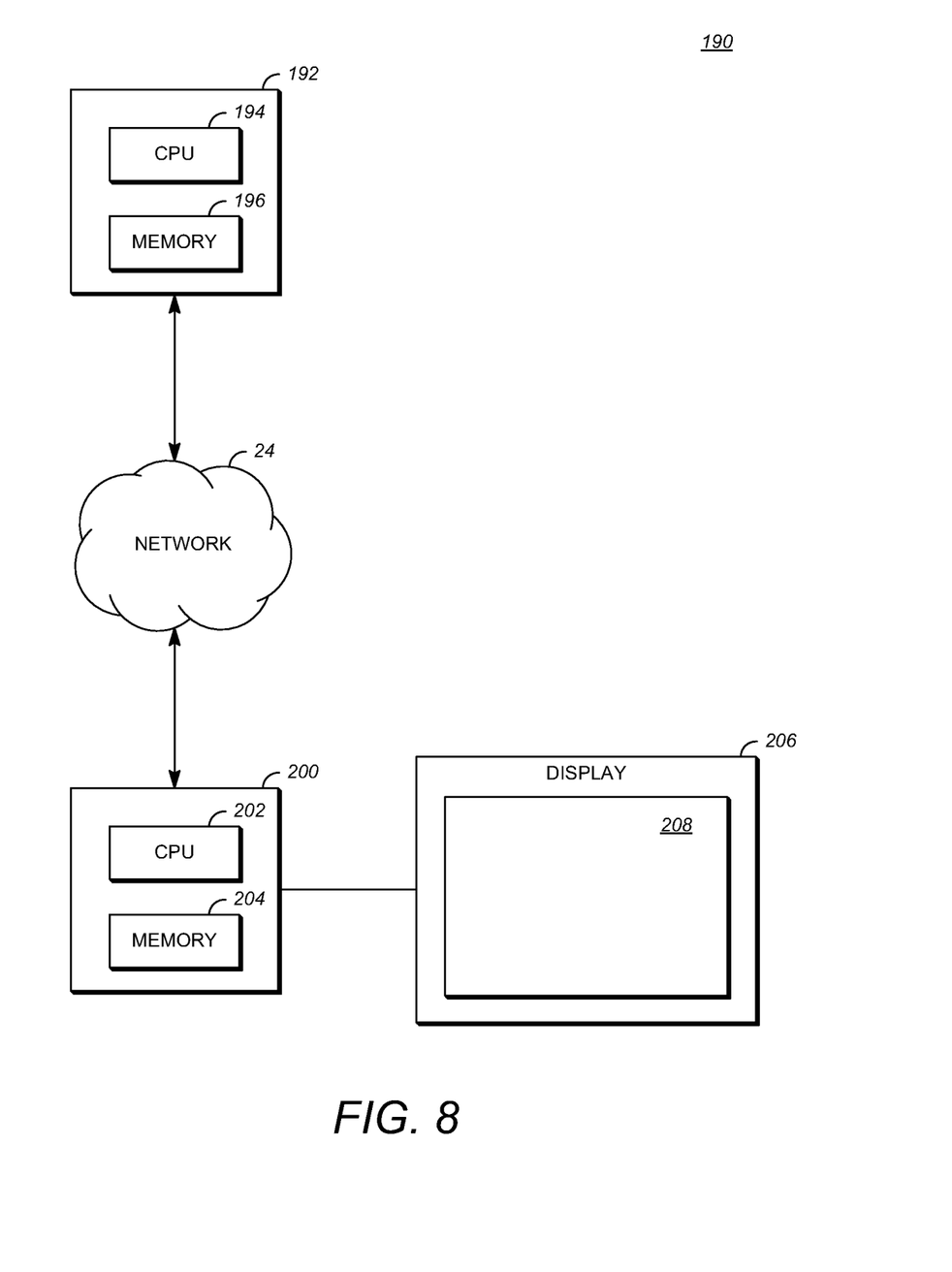
FIG. 8 is a block diagram of computer systems implementing the data transmitting system including the selection of error correction codes described herein.

FIG. 8 is a block diagram of computer systems implementing the data transmission system including the selection of error correction codes described herein.

An exemplary transmitting station 192 has the functions shown in FIG. 5 and can be, for example, a computer having an internal configuration of hardware including a processor such as a central processing unit (CPU) 194 and a memory 196. CPU 194 can be a controller for controlling the operations of the transmitting station 12. CPU 194 is connected to memory 196 by, for example, a memory bus (not shown). Memory 16 can be read only memory (ROM), random access memory (RAM) and/or any other suitable memory device. Memory 16 can store data and program instructions that are used by CPU 194, particularly those described for encoder 112, packetization process 116, FEC encoder 120 and UEP/EP selector 130. CPU 194 can thus use the program instructions to determine at least one network state parameter associated with the source packets to be transmitted and select, based on the type of source packet to be transmitted and the network state, an error correction code to be transmitted along with the source packet. Other suitable implementations of transmitting station 192 are possible. For example, the processing of the transmitting station 192 can be distributed among multiple devices.

Network 24 connects transmitting station 192 and a receiving station 200. Receiving station 200 can correspond to receiver 25 of FIG. 1 in one example. A data stream, such as video stream 110 of FIG. 5, can be encoded in transmitting station 192 and the encoded video stream can be transmitted to receiving station 200 and decoded in receiving station 200. In this example, the encoded data stream would include source packets and error correction codes. Network 24 can, for example, be the Internet. Network 24 can also be a local area network (LAN), wide area network (WAN), virtual private network (VPN), cellular phone network or any other means of transferring the data stream from the transmitting station 192.

The receiving station 200, in one example, can be a computer having an internal configuration of hardware including a processor such as a central processing unit (CPU) 202 and a memory 204. CPU 202 can be a controller for controlling the operations of receiving station 200. CPU 202 can be connected to memory 204 by, for example, a memory bus (not shown). Memory 204 can be ROM, RAM and/or any other suitable memory device. Memory 204 stores data and program instructions that are used by CPU 202 particularly those described for FEC decoder 26, de-packetization process 30 and decoder 34 in this example. CPU 202 so configured can, in this example, decode the transmitted source packets along with error correction codes, correcting the source packets when necessary with the error correction codes according to known methods. Other suitable implementations of receiving station 200 are possible. For example, the processing of receiving station 200 can be distributed among multiple devices.

In FIG. 8, a display 206 configured to display a data such as a video stream can be connected to receiving station 200. In some implementations, receiving station 200 includes display 206. Display 206 can be implemented in various ways, including by a liquid crystal display (LCD) or a cathode-ray tube (CRT) or light emitting diode (LED) display, such as an OLED display. Display 206 is coupled to CPU 202 and can be configured to display a decoded video stream 208 at receiving station 200.

The particular method used to encode or decode the data stream herein is not critical or limited. For example, digital video streams can include formats such as VPx, promulgated by Google Inc. of Mountain View, Calif., and H.264, a standard promulgated by ITU-T Video Coding Experts Group (VCEG) and the ISO/IEC Moving Picture Experts Group (MPEG), including present and future versions thereof. H.264 is also known as MPEG-4 Part 10 or MPEG-4 AVC (formally, ISO/IEC 14496-10). Such video compression can be used to reduce the volume of bits needed to transmit, store or otherwise represent digital video and can be used herein.

Other implementations of the data transmission system 190 are possible. For example, one implementation can omit network 24 and/or display 206. In another implementation, a video stream can be encoded and then stored for transmission at a later time by receiving station 200 or any other device having memory. In another implementation, additional components can be added to data transmission system 190. For example, a display or a video camera can be attached to transmitting station 192 to capture a video stream to be encoded. In an exemplary implementation, the real-time transport protocol (RTP) is used. In another implementation, for example, a transport protocol other than RTP may be used.

The embodiments of transmitting station 192 and receiving station 200 (and the algorithms, methods, instructions, etc. stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors or any other suitable circuit. In the claims, the term "processor" should be understood as encompassing any of the foregoing hardware, either singly or in combination. The terms "signal" and "data" are used interchangeably. Further, portions of transmitting station 192 and receiving station 200 do not necessarily have to be implemented in the same manner.

Further, in one embodiment for example, transmitting station 192 or receiving station 200 can be implemented using a general purpose computer/processor with a computer program that, when executed, carries out any of the respective methods, algorithms and/or instructions described herein. In addition or alternatively, for example, a special purpose computer/processor can be utilized which can contain specialized hardware for carrying out any of the methods, algorithms, or instructions described herein.

All or a portion of embodiments of the present invention can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments have been described in order to allow easy understanding of the present invention and do not limit the present invention. On the contrary, the invention is intended to cover various modifications and equivalent arrangements included within the scope of the claims, which scope is to be accorded the broadest interpretation so as to encompass all such modifications and equivalent structure as is permitted under the law.

What is claimed is:

1. A method for dynamically selecting forward error correction codes for use with a plurality of source packets to be transmitted over a network, the plurality of source packets having frames and first partition packets, comprising:
  A) determining at least one source content parameter of a first plurality of source packets;
  B) determining at least one network state parameter of the network over which the first plurality of source packets and a plurality of error correction packets protecting the first plurality of source packets are transmitted to a decoder;
  C) selecting one of an equal protection forward error correction code or an unequal protection forward error correction code to apply to the first plurality of source packets based on the at least one source content parameter and the at least one network state parameter using a processor;
  D) generating the plurality of error correction packets protecting the first plurality of source packets by applying the equal protection forward error correction code or the unequal protection forward error correction code to the first plurality of sources packets, wherein each source packet of the first plurality of source packets is protected by a same number of error correction packets of the plurality of error correction packets when the equal protection forward error correction code is applied, and at least a first source packet of the first plurality of source packets is protected by a different number of error correction packets of the plurality of error correction packets than a second source packet of the first plurality of source packets when the unequal protection forward error correction code is applied; and E) generating a data stream comprising the first plurality of source packets and the plurality of error correction packets formed by applying the equal protection forward error correction code or the unequal protection forward error correction code in step D) to the first plurality of source packets.

2. The method of claim 1 wherein the at least one source content parameter includes at least one of a motion level (ML), a spatial level (SL), a protection factor (PF), a size (c) of a first partition relative to a total frame size and a frame rate (f).

3. The method of claim 2, further comprising:
holding the protection factor (PF) constant while performing steps A)-D) for a second plurality of source packets.

4. The method of claim 1 wherein the at least one network state parameter includes a network rate (R), a packet loss (p) and a burst length (b).

5. The method of claim 1 wherein an off-line function y=F(ML, SL, PF, c, R, f, p, b) is used to select the one of the equal protection forward error correction code or the unequal protection forward error correction code, wherein the function is generated from clustering a database of video clips into one state that is favorable to equal protection, and another state that is favorable to unequal protection, where the two states are defined by applying a threshold on y; and wherein
ML is a motion level of the first plurality of packets;
SL is a spatial level of the first plurality of packets;
PF is a protection factor of the first plurality of packets;
c is a size of a first partition relative to a total frame size;
f is a frame rate;
R is a network rate of the network;
p is a packet loss of the network; and
b is a burst length of the network.

6. The method of claim 5, wherein a support vector machine is used for the clustering process.

7. The method of claim 1, further comprising:

calculating a result of an equation $y=G(ML)*J(PF/c)$; wherein

G is a function mapping motion level (ML) into a plurality of discrete states; and
J is a sigmoid function that maps the ratio between a protection factor of a first partition size relative to the total frame size PF/c to a number that approaches 1 for PF/c>> above a transition point C1, asymptotically approaches 0 for PF/c<< below a transition point C2, wherein C2<C1, and interpolates smoothly in between; and wherein
PF is the protection factor of the first plurality of packets; and
c is the first partition relative to the total frame size; and
wherein selecting the one of the equal protection forward error correction code or the unequal protection forward error correction code is based on the result.

8. The method of claim 7 where the model parameters C1,C2 of the function J are set based on the burst length and the error concealment property of the decoder.

9. The method of claim 7 wherein the function G(ML) maps the motion level (ML) according to:

$G(ML=0)=0$;

$G(ML=1)=1$; and $G(ML=2)=x$;

where x is a parameter greater than 1.

10. The method of claim 7 wherein selecting the one of the equal protection forward error correction code or the unequal protection forward error correction code is based on a number of source packets in a frame (n), a number of first partition packets (k) in the frame and a number of forward error correction packets generated for the frame (m).

11. The method of claim 10 wherein selecting the unequal protection forward error correction code involves using a designated number (z) of FEC packets for the first partition, where z=H(n,m,k) and H is a function of n, m and k.

12. The method of claim 10, where z=min(k,m/2).

13. The method of claim 1 wherein the unequal protection forward error correction code is selected and the unequal protection forward error correction code includes one or more equal protection forward error correction codes.

14. The method of claim 13 wherein the unequal protection forward error correction code is selected and the unequal protection forward error correction code includes an equal protection forward error correction code that is modified by inserting more 1s into columns of an equal protection packet mask, for the columns belonging to the first partition.

15. The method of claim 1 wherein the first plurality of source packets comprises video data.

16. The method of claim 15 wherein packets of the first plurality of source packets are of unequal value.

17. The method of claim 1, further comprising:
determining the at least one source content parameter and the at least one network state parameter while the plurality of source packets are being transmitted over the network.

18. An apparatus for dynamically selecting forward error correction codes for use with a plurality of source packets to be transmitted over a network, the apparatus comprising:
a memory; and
a processor configured to execute instructions stored in the memory to:
A) determine at least one source content parameter of a first plurality of source packets;
B) determine at least one network state parameter of the network over which the first plurality of source packets and a plurality of error correction packets protecting the first plurality of source packets are transmitted to a decoder;
C) select between an equal protection forward error correction code and an unequal protection forward error correction code for the first plurality of source packets based on the at least one source content parameter and the at least one network state parameter; and
D) generate a data stream comprising the first plurality of source packets and the plurality of error correction packets formed using the equal protection forward error correction code or the unequal protection forward error correction code as selected; and the processor is configured to:

calculate a result of an equation $y=G(ML)*J(PF/c)$; wherein

G is a function mapping motion level (ML) into a plurality of discrete states; and
J is a sigmoid function PF/c that maps the ratio between a protection factor PF of the first plurality of source packets to a size c of a first partition relative to a total frame size; and
wherein selecting between the equal protection forward error correction code and the unequal protection forward error correction code is based on the result.

19. The apparatus of claim 18 wherein the at least one source content parameter includes at least one of a motion level (ML), a spatial level (SL), the protection factor (PF), the size (c) and a frame rate (f).

20. The apparatus of claim 19 further comprising:
holding the protection factor (PF) constant while performing steps A)-D) for a second plurality of source packets.

21. The apparatus of claim 18 wherein the at least one network state parameters includes at least one of a network rate (R), a packet loss (p) and a burst length (b).

22. The apparatus of claim 18 wherein:
the sigmoid function J maps PF/c to a number that approaches 1 for PF/c>> above a transition point C1, asymptotically approaches 0 for PF/c<< below a transition point C2, wherein C2<C1, and interpolates smoothly in between.

23. The apparatus of claim 22 where the model parameters C1,C2 of the function J are set based on the burst length and the error concealment property of the decoder.

24. The apparatus of claim 22 wherein the function G(ML) maps the motion level (ML) according to:

$G(ML=0)=0;$ $G(ML=1)=1;$ and $G(ML=2)=x;$ where x is a parameter greater than 1.

25. The apparatus of claim 18 wherein the unequal protection forward error correction code is selected and the unequal protection forward error correction code includes one or more equal protection forward error correction codes.

26. The apparatus of claim 25 wherein the unequal protection forward error correction code is selected and the unequal protection forward error correction code includes an equal protection forward error correction code that is modified by inserting more 1s into columns of an equal protection packet mask, for the columns belonging to the first partition.

27. The apparatus of claim 18 wherein the first plurality of source packets comprises video data.

28. The apparatus of claim 18 wherein packets of the first plurality of source packets are of unequal value.

29. The apparatus of claim 18, further comprising:
determining the at least one source content parameter and the at least one network state parameter while the plurality of source packets are being transmitted over the network.

30. An apparatus for dynamically selecting forward error correction codes for use with a plurality of source packets to be transmitted over a network, the apparatus comprising:
a memory; and
a processor configured to execute instructions stored in the memory to:
A) determine at least one source content parameter of a first plurality of source packets;
B) determine at least one network state parameter of the network;
C) select between an equal protection forward error correction code and an unequal protection forward error correction code for the first plurality of source packets based on the at least one source content parameter and the at least one network state parameter;
D) generate a plurality of error correction packets protecting the first plurality of source packets by applying the equal protection forward error correction code or the unequal protection forward error correction code to the first plurality of sources packets, wherein each source packet of the first plurality of source packets is protected by a same number of error correction packets of the plurality of error correction packets when the equal protection forward error correction code is applied, and at least a first source packet of the first plurality of source packets is protected by a different number of error correction packets of the plurality of error correction packets than a second source packet of the first plurality of source packets when the unequal protection forward error correction code is applied; and
E) generate a data stream comprising the first plurality of source packets and the plurality of error correction packets generated using the equal protection forward error correction code or the unequal protection forward error correction code as selected;
wherein the selecting between an equal protection forward error correction code and an unequal protection forward error correction code is based on a number of source packets in a frame (n), a number of first partition packets in the frame (k) and a number of forward error correction packets generated for the frame (m).

31. The apparatus of claim 30 wherein selecting the unequal protection type involves using a designated number (z) of FEC packets for the first partition, where z=H(n,m,k) and H is a function of n, m and k.

32. The apparatus of claim 31, where z=H(n,m,k)=min(k, m/2).

* * * * *

UNITED STATES PATENT AND TRADEMARK OFFICE
CERTIFICATE OF CORRECTION

PATENT NO. : 8,856,624 B1
APPLICATION NO. : 13/283184
DATED : October 7, 2014
INVENTOR(S) : Marco Paniconi Page 1 of 1

It is certified that error appears in the above-identified patent and that said Letters Patent is hereby corrected as shown below:

In the Claims,

Column 13, Claim 24, Line 25, "G(ML-1)-1; and" should be "G(ML=1)=1; and"

Signed and Sealed this
Sixth Day of January, 2015

Michelle K. Lee
*Deputy Director of the United States Patent and Trademark Office*